United States Patent
Galbraith et al.

(10) Patent No.: US 6,313,962 B1
(45) Date of Patent: Nov. 6, 2001

(54) COMBINED READ AND WRITE VCO FOR DASD PRML CHANNELS

(75) Inventors: Richard L. Galbraith; Joe Martin Poss; David James Stanek; Peter John Windler, all of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/213,038

(22) Filed: Dec. 16, 1998

(51) Int. Cl.$^7$ .................................................. G11B 5/09
(52) U.S. Cl. ................................................. 360/46; 360/51
(58) Field of Search .......................................... 360/51, 46

(56) References Cited

U.S. PATENT DOCUMENTS

| | | | |
|---|---|---|---|
| 5,206,769 | * 4/1993 | Bailey et al. | 360/51 |
| 5,357,520 | 10/1994 | Arnett et al. | 714/719 |
| 5,416,806 | 5/1995 | Coker et al. | 360/32 |
| 5,422,760 | * 6/1995 | Abbott et al. | 360/51 |
| 5,978,426 | 11/1999 | Glover et al. | 360/51 |

FOREIGN PATENT DOCUMENTS

| | | |
|---|---|---|
| 0 644 659 | 3/1995 | (EP) . |
| 0 727 877 A | 8/1996 | (EP) . |
| 0 822 664 A | 2/1998 | (EP) . |
| 10 031868 A | 2/1998 | (JP) . |
| 99 13580 A | 3/1999 | (WO) . |

* cited by examiner

Primary Examiner—Regina Y. Neal

(74) Attorney, Agent, or Firm—Merchant & Gould; Mark A. Hollingsworth

(57) ABSTRACT

A combined read and write VCO for data channels is disclosed. The combined read and write VCO for data channels shares a common loop capacitor while providing optimal read and write VCO loop responses, and allows the VCO to relock to the write timebase after a read very quickly while maintaining an accurate timebase. The combined read and write VCO includes an oscillator providing an output signal having a frequency that varies proportionately to an oscillator input signal and an adjustable voltage source, the adjustable voltage source having a first configuration for a write mode and a second configuration for a read mode, and the adjustable voltage source providing the oscillator input signal to the oscillator in response to receiving an input current signal. The adjustable voltage source includes a first and second capacitor coupled in series and a switch coupled across the second capacitor, the switch being open to provide the first configuration and closed to provide the second configuration. The oscillator further includes a transconductance amplifier for receiving the input signal from the adjustable voltage source and converting the input signal to a current signal having a first current value, a current modifier, the current modifier providing a current phase signal according to whether a write or a read mode is selected and whether an acquisition or track mode is selected, an adder, coupled to the transconductance amplifier and the current modifier, the adder modifying the current signal according to the current phase signal to produce an adjusted current signal and a current controlled oscillator, coupled to the adder, the current controlled oscillator receiving the adjusted current signal and producing an output signal having a frequency proportional to a magnitude of the current of the adjusted current signal.

30 Claims, 8 Drawing Sheets

COMBINED READ AND WRITE VCO FOR DASD PRML CHANNELS

BACKGROUND OF THE INVENTION

1. Field of the Invention

This invention relates in general to magnetic storage systems, and more particularly to combined read and write VCO for data channels.

2. Description of Related Art

In computer systems, information is stored on magnetic storage systems such as hard drives. Data is stored in a series of spiral or concentric rings known as tracks. The data includes streams of magnetic polarity transitions on the disk surface. A number of schemes are used to detect these transitions and data.

One data detection method is a peak detection system. Peak detection ensures the accurate reading of the magnetic transitions that encode the bits on a disk. These magnetic transitions are given a 1 or 0 value. In reading two adjacent transitions, i.e. two adjacent 1s, the signals can interfere with each other and cancel each other out. To avoid this "intersymbol" interference the data must be encoded which results in a coded data string that is about 50% longer than an uncoded string. This extended code takes up disk space and limits bit density.

PRML overcomes this by comparing a data string with all known possible data strings to determine its identity. A PRML channel can be used to achieve high data density in writing and reading digital data on magnetic recording disks. This technique takes inter-symbol interference into account rather than tying to eliminate it. The result is a far more efficient coding scheme that permits more bits to be encoded on a track.

The actual control mechanism for PRML is in the selection of the partial response targets or polynomials which are chosen. In a PRML channel, the incoming signal from the preamplifier is first equalized and then sampled according to the partial response regimen selected. These samples are then fed to the maximum likelihood sequence detection circuitry, commonly a Viterbi detector, which identifies a sequence of bits read from the drive that would be the most likely to cause this sampled pattern. Since detection is applied to a sequence of bits rather than a series of individual bits, the PRML detector does a much better job of resolving marginal bit transitions, and therefore tolerates a much higher bit density (hence lower SNR) without increasing bit error rates.

PRML channels require timebase generation during write operations and timebase capture during read operations. Previous channel designs used separate voltage controlled oscillators (VCOs) for read and write operations. The write VCO (timebase generator) runs the entire time the channel is enabled due to its slow response. The write VCO can not be stopped during a read because, after the read ends and the write VCO is restarted, the write VCO takes too long to reacquire an accurate timebase, thus forcing the DASD product to wait until the channel was ready before performing a write operation and having an adverse effect on performance.

The read VCO (timebase capture) also runs the entire time the channel is enabled due to the need for quick timing capture at the beginning of every read. When the channel is not reading, the read VCO is locked to the write VCO, so the read VCO is at the correct frequency when a read begins. This substantially improves the time required to capture the frequency and phase of the signal being read, since the frequencies should nearly match, even though spindle speed tolerance can induce a difference.

Thus, previous channels have all used separate read and write VCOs for performance reasons, but all suffer from the same problems. For example, excess power is used during read operations due to the write VCO. Also, providing two VCOs and associated circuitry increases the chip size. Further, increased clock noise coupling occurs during read operations due to the write VCO It can be seen that there is a need for a combined read and write VCO for data channels.

SUMMARY OF THE INVENTION

To overcome the limitations in the prior art described above, and to overcome other limitations that will become apparent upon reading and understanding the present specification, the present invention discloses a combined read and write VCO for data channels.

The present invention solves the above-described problems by providing a combined read and write VCO for data channels that shares a common loop capacitor while providing optimal read and write VCO loop responses, and allows the VCO to relock to the write timebase after a read very quickly while maintaining an accurate timebase.

A system in accordance with the principles of the present invention includes an oscillator providing an output signal having a frequency that varies proportionately to an oscillator input signal and an adjustable voltage source, the adjustable voltage source having a first configuration for a write mode and a second configuration for a read mode, and the adjustable voltage source providing the oscillator input signal to the oscillator in response to receiving an input current signal.

Other embodiments of a system in accordance with the principles of the invention may include alternative or optional additional aspects. One such aspect of the present invention is that the adjustable voltage source includes a first and second capacitor coupled in series and a switch coupled across the second capacitor, the switch being open to provide the first configuration and closed to provide the second configuration.

Another aspect of the present invention is that the oscillator further includes a transconductance amplifier for receiving the input signal from the adjustable voltage source and converting the input signal to a current signal having a first current value, a current modifier, the current modifier providing a current change signal according to whether a write or a read mode is selected and whether an acquisition or track mode is selected, an adder, coupled to the transconductance amplifier and the current modifier, the adder modifying the current signal according to the current change signal to produce an adjusted current signal and a current controlled oscillator, coupled to the adder, the current controlled oscillator receiving the adjusted current signal and producing an output signal having a frequency proportional to a magnitude of the current of the adjusted current signal.

Another aspect of the present invention is that the current phase signal provides up to a ten percent phase change when the acquisition mode is selected.

Another aspect of the present invention is that the current phase signal provides up to a one percent phase change when the read mode and the tracking mode are selected.

Another aspect of the present invention is that the current phase signal provides a 0.5 percent phase change when the write mode and the tracking mode are selected.

Another aspect of the present invention is that the input current signal has a range of ±1.0 milliamp when the acquisition mode is selected.

Another aspect of the present invention is that the input current signal has a range of ±62.5 microamps when the read mode and the tracking mode are selected.

Another aspect of the present invention is that the input current signal has a range of ±32.0 microamps when the write mode and the tracking mode are selected.

Another aspect of the present invention is that the adjustable voltage source includes a write capacitor and a read capacitor coupled in series and a switch coupled across the read capacitor, the switch being open to provide the first configuration, the first configuration being a read mode, and closed to bypass the read capacitor and provide the second configuration, the second configuration being a write mode.

Another aspect of the present invention is that a predetermined delay is used before closing the switch to provide a predetermined delay between transitioning from the read mode to the write mode to maintain a correct frequency for back-to-back read operations.

Another aspect of the present invention is that the delay includes a one microsecond delay.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a combined read and write VCO for data channels. The combined read and write VCO for data channels shares a common loop capacitor while providing optimal read and write VCO loop responses, and allows the VCO to relock to the write timebase after a read very quickly while maintaining an accurate timebase.

Figure 1:
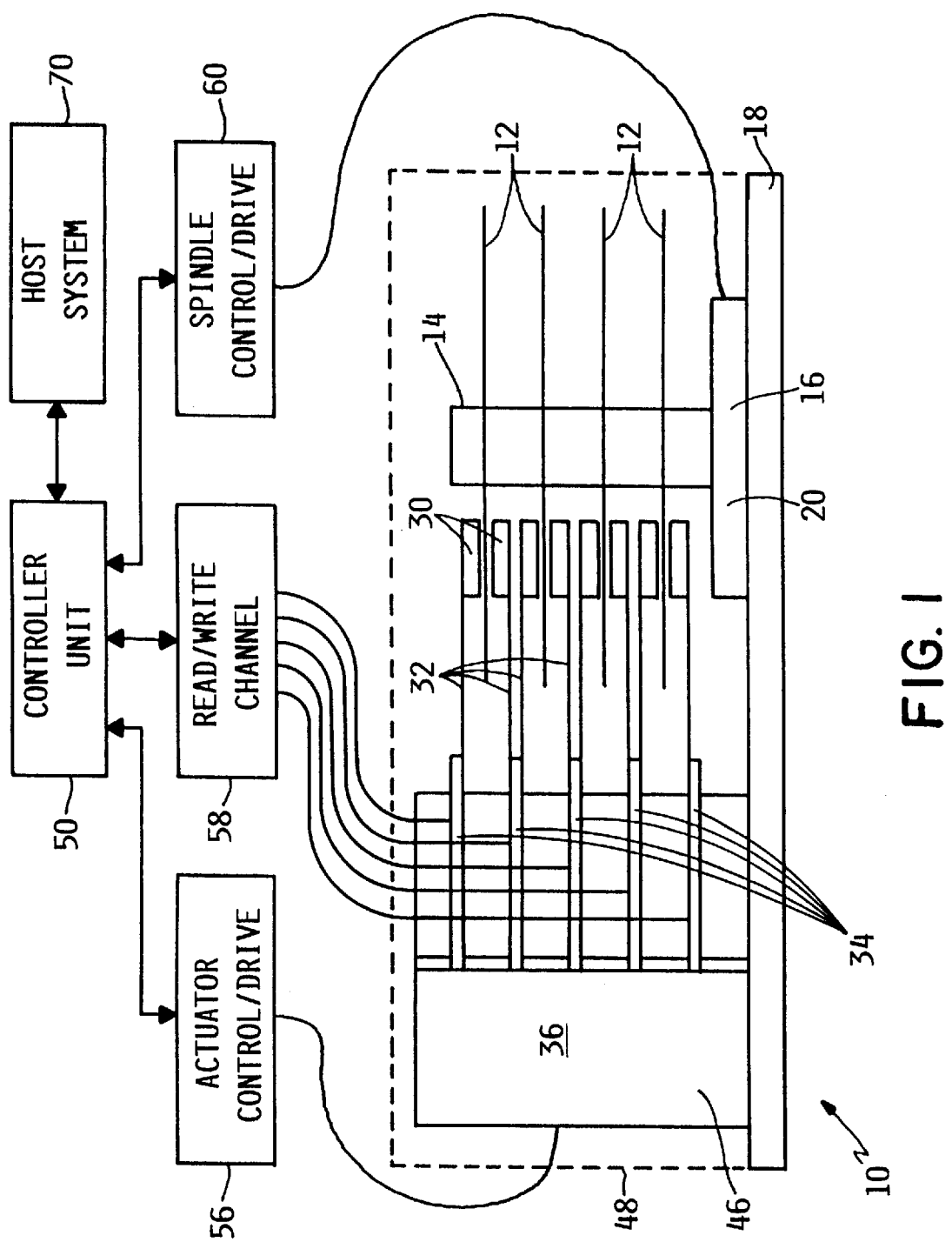
FIG. 1 illustrates a schematic diagram of a data storage system suitable for practicing the present invention.

FIG. 1 shows a schematic diagram of a data storage system 10 suitable for practicing the present invention. System 10 includes a plurality of magnetic recording disks 12. Each disk has a plurality of concentric data tracks. Disks 12 are mounted on a spindle motor shaft 14 which is connected to a spindle motor 16. Motor 16 is mounted to a chassis 18. The disks 12, spindle 14, and motor 16 include a disk stack assembly 20.

A plurality of sliders 30 having read/write heads are positioned over the disks 12 such that each surface of the disks 12 has a corresponding slider 30. Each slider 30 is attached to one of the plurality of suspensions 32 which in turn are attached to a plurality of actuator arms 34. Arms 34 are connected to a rotary actuator 36. Alternatively, the arms 34 may be an integral part of a rotary actuator comb. Actuator 36 moves the heads in a radial direction across disks 12. Actuator 36 typically includes a rotating member 38 mounted to a rotating bearing 40, a motor winding 42 and motor magnets 44. Actuator 36 is also mounted to chassis 18. Although a rotary actuator is shown in the preferred embodiment, a linear actuator could also be used. The sliders 30, suspensions 32, aims 34, and actuator 36 include an actuator assembly 46. The disk stack assembly 20 and the actuator assembly 46 are sealed in an enclosure 48 (shown by dashed line) which provides protection from particulate contamination.

A controller unit 50 provides overall control to system 10. Controller unit 50 typically contains a central a processing unit (CPU), memory unit and other digital circuitry. Controller 50 is connected to an actuator control/drive unit 56 which in turn is connected to actuator 36. This allows controller 50 to controller 50 to control the movement of sliders 30 over disks 12. The controller 50 is a connected to a read/write channel 58 which in turn is connected to the heads of the sliders 30. This allows controller 50 to send and receive data from the disks 12. Controller 50 is connected to a spindle control/drive unit 60 which in turn is connected to spindle motor 16. This allows controller 50 to control the rotation of disks 12. A host system 70, which is typically a computer system, is connected to the controller unit 50. System 70 may send digital data to controller 50 to be stored disks 12, or may request that digital data be read from disks 12 and sent to the system 70. The basic operation of DASD units is well known in the art and is described in more detail in Magnetic Recording Handbook, C. Dennis Mee and Eric D. Daniel, McGraw Hill Book Company, 1990.

Figure 2:
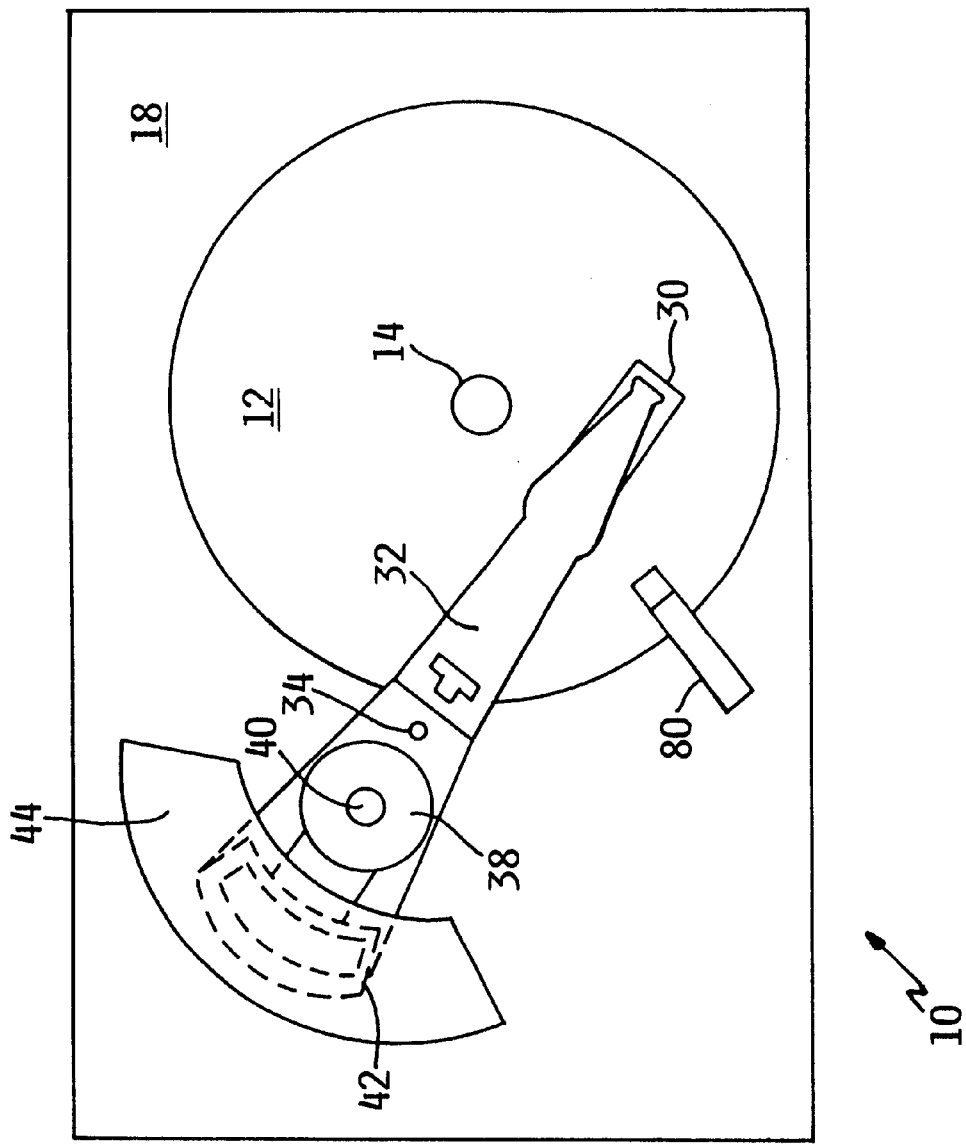
FIG. 2 shows top view of the system in FIG. 1.

FIG. 2 shows top view of system 10. A loading ramp member 80 is located at the edge of the disk stack assembly 20. Member 80 automatically unloads the sliders 30 from the disks 12 as actuator 36 moves the sliders 30 to the outer disk position. To unload a slider or head means to move it a vertical distance away from its corresponding disk surface. The ramp 80 is optional. Alternatively, the sliders 30 may be placed permanently in the loaded position between the disks.

Figure 3:
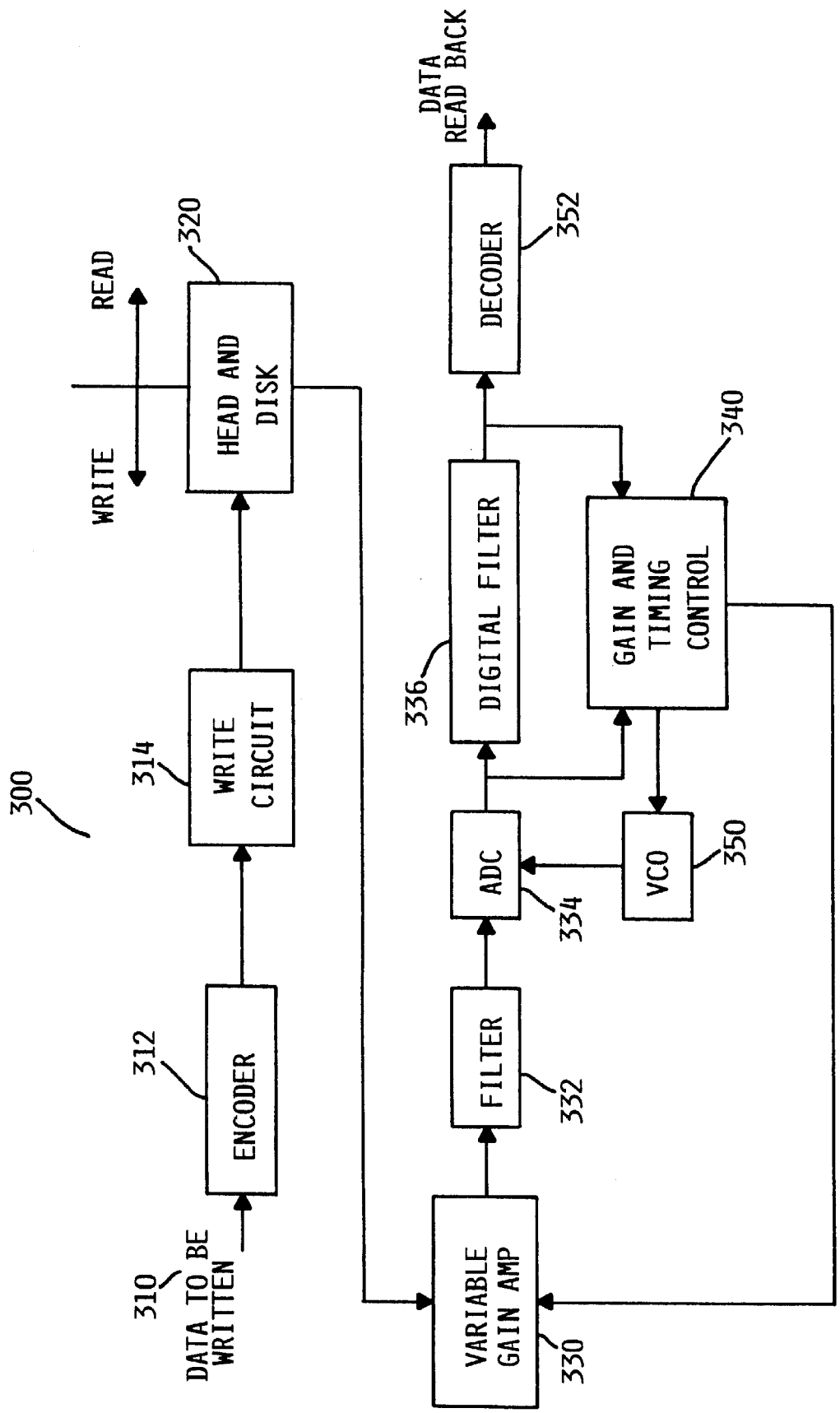
FIG. 3 illustrates a block diagram of a PRML data channel.

FIG. 3 illustrates a block diagram of a PRML data channel 300. In FIG. 3, data to be written 310 is encoded in encoder 312 and passed to write circuit 314. The write circuit 314 provides a modulated write current according to a generated timebase, wherein the modulated write current is provided to a transducer (not shown) for writing to the disk surface. An analog read signal is obtained at the head and disk block 320. The read signal is applied to a variable gain amplifier (VGA) 330. The amplified read signal is applied to a filter 332. The filtered read signal is converted to digital form by an analog-to-digital converter (ADC) 334. The samples of the ADC 334 are applied to a digital filter 336 and to a gain and timing control 340. The gain and timing control 340 provides a gain control signal to the VGA 330 and provides a timing control signal to the ADC 334 via a voltage controlled oscillator 350, the VCO providing a timebase capture during the read operations. The filter signal for the digital filter 336 is applied to a decoder 352 to complete the data read back.

As can be seen from FIG. 3, PRML channels require timebase generation during write operations and timebase capture during read operations. As stated above, previous channel designs used separate voltage controlled oscillators (VCOs) in the read channel and in the write channel to provide the read and write operations.

Figure 4:
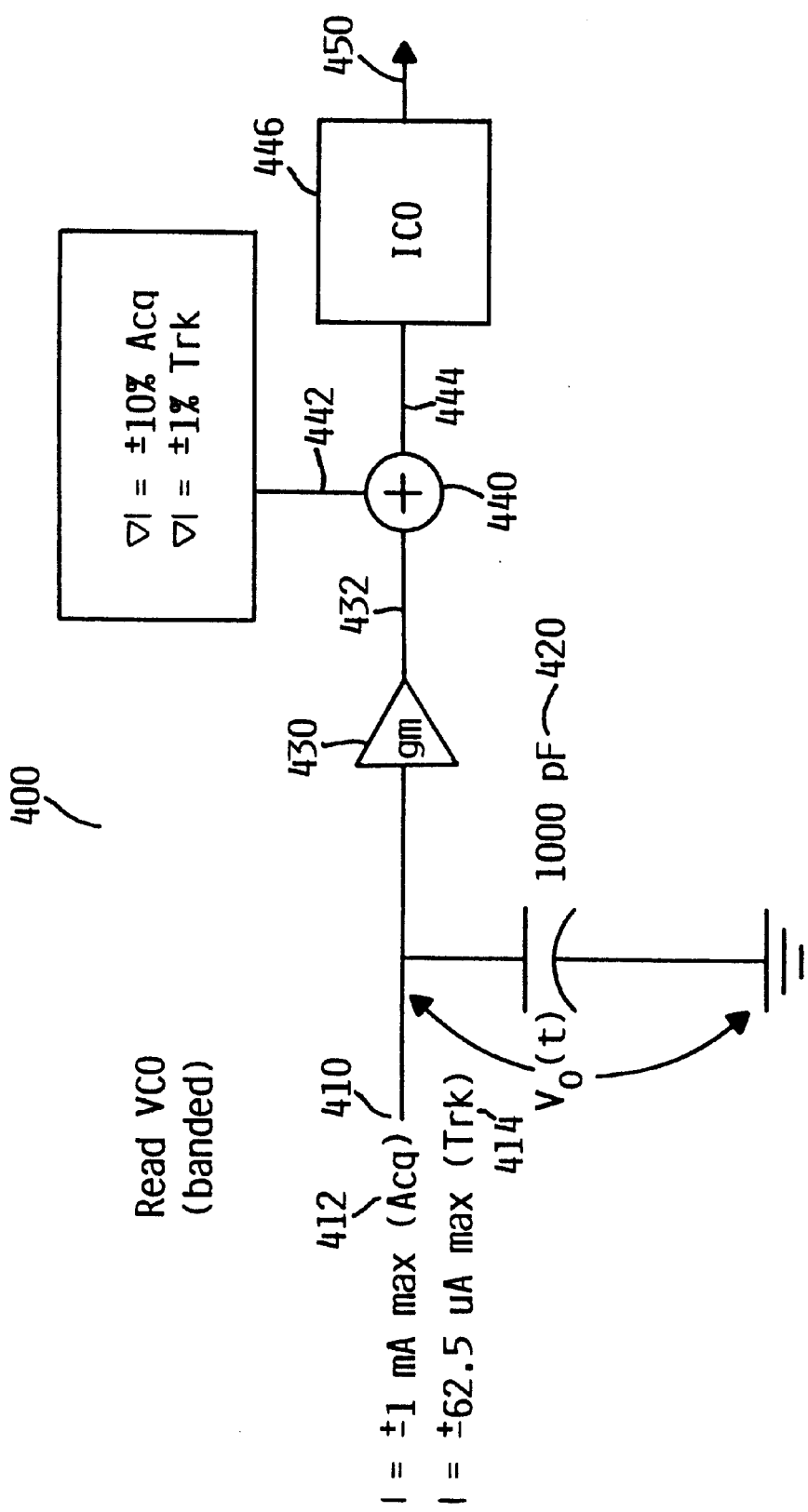
FIG. 4 illustrates a read VCO.

FIG. 4 illustrates a read VCO 400. The read VCO receives current signals 410 from the charge pumps (not shown). During acquisition 412, the current is ±1 milliamp maximum. During tracking 414, the current is ±62.5 microamps maximum. A capacitor 420 develops an output voltage $v_o(t)$. In the read VCO, the capacitor typically has a value on the order of 1000 picofarads. However, those skilled in the art will recognize that the present invention is not meant to be limited to a capacitance shown, but rather the capacitance may be chosen according to other design considerations.

A transconductance amplifier 430 is coupled to the capacitor 420 and converts the output voltage signal $v_o(t)$ to an output current 432. An adder 440 receives the output current 432 which is adjusted by a phase current 442. The phase current 442 range is ±10% during the acquisition mode and ±1.0% during the tracking mode. The adjusted current 444 from the adder is applied to a current controlled oscillator 446 which generates an output signal 450 having a frequency which is proportional to the adjusted current 444.

Figure 5:
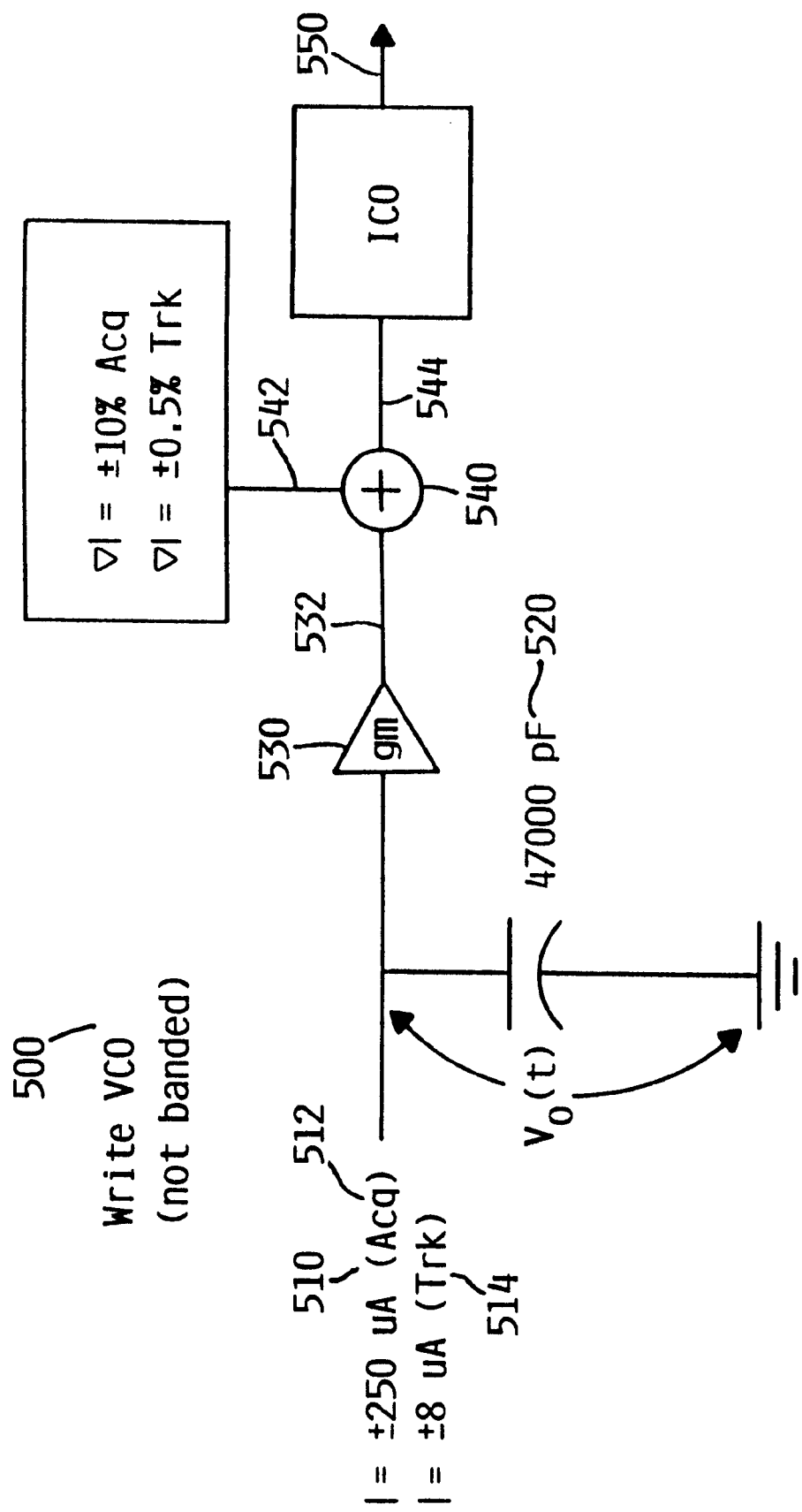
FIG. 5 illustrates a write VCO.

FIG. 5 illustrates a write VCO 500. The write VCO receives current signals 510 from the charge pumps (not shown). During acquisition 512, the current is ±250 microamps maximum. During tracking 514, the current is ±8.0 microamps maximum. A capacitor 520 develops an output voltage $v_o(t)$. In the write VCO, the capacitor typically has a value on the order of 47,000 picofarads. However, those skilled in the art will recognize that the present invention is not meant to be limited to a capacitance shown, but rather the capacitance may be chosen according to other design considerations.

A transconductance amplifier 530 is coupled to the capacitor 520 and converts the output voltage signal $v_o(t)$ to an output current 532. An adder 540 receives the output current 532 which is adjusted by a phase current 542. The phase current 542 is ±10% during the acquisition mode and ±0.5% during the tracking mode. The adjusted current 544 from the adder is applied to a current controlled oscillator 546 which generates an output signal 550 having a frequency which is proportional to the adjusted current 544.

Figure 6:
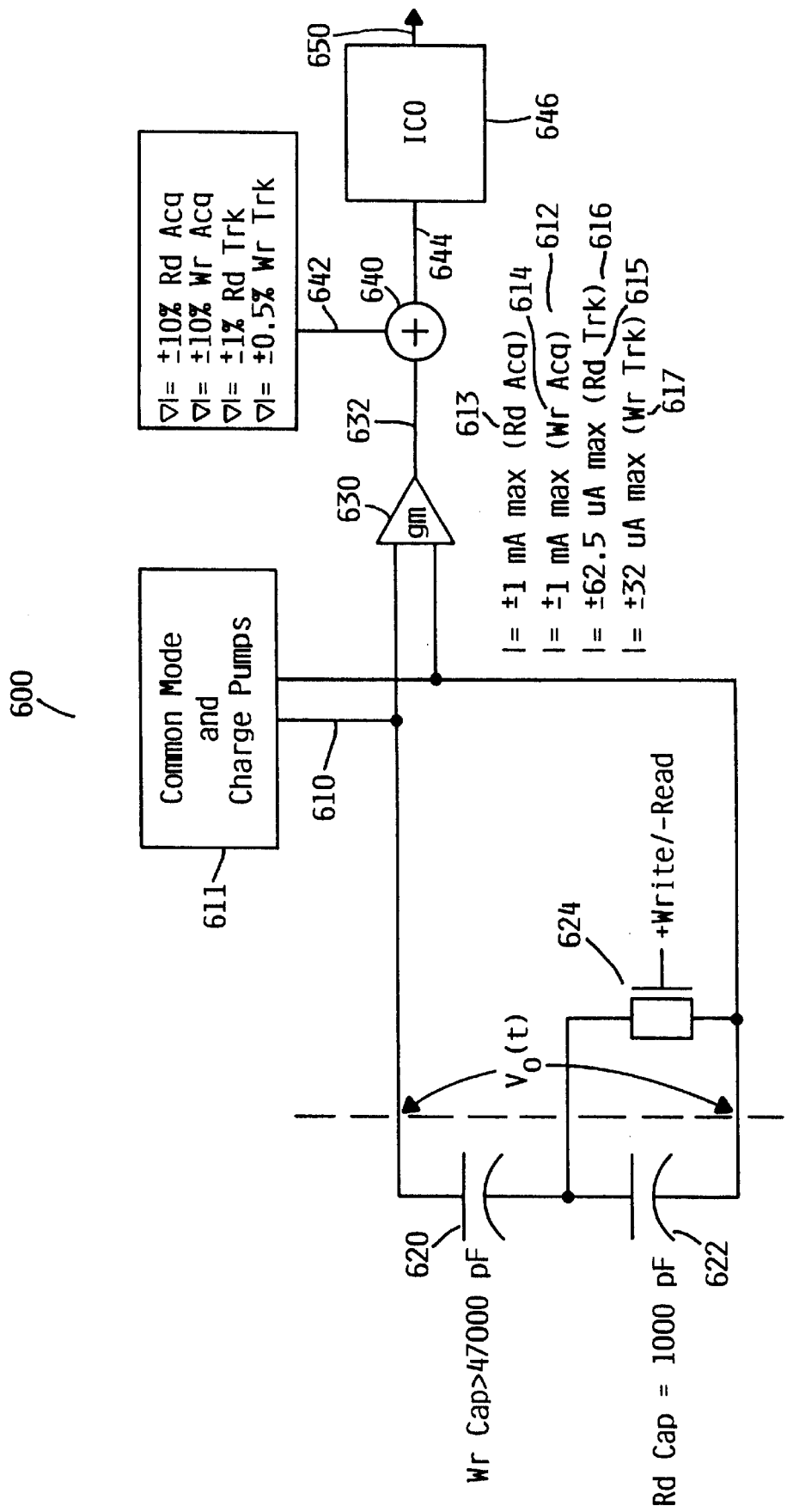
FIG. 6 illustrates a combined read and write VCO according to the present invention.

FIG. 6 illustrates a combined read and write VCO 600 according to the present invention. The write VCO receives current signals 610 from the charge pumps 611. During acquisition 612, the read 613 and write 614 current is ±1 milliamp maximum. During tracking 616, the read current 615 is ±62.5 microamps maximum and the write current 617 is ±32.0 microamps maximum. Two capacitors 620, 622 are coupled in parallel. A bypass switch 624 is coupled across capacitor 622. The switch 624 shorts out the read loop capacitor 624 when the combined read and write VCO is not in the read mode. The capacitors 620, 622 develop an output voltage $v_o(t)$. Again, the write capacitor 620 is shown having a value on the order of 47,000 picofarads and the read capacitor 622 is shown having a value on the order of 1000 picofarads. However, those skilled in the art will recognize that the present invention is not meant to be limited to the capacitance shown, but rather the capacitance for the read and the write capacitors may be chosen according to other design considerations.

A transconductance amplifier 630 is coupled to the capacitors 620, 622 and aconverts the output voltage signal $v_o(t)$ to an output current 632. An adder 640 receives the output current 632 which is adjusted by a phase current 642. The phase current range 642 is ±10% during both the read and the acquisition mode. The phase current range 642 is ±1.0% during the read tracking mode and ±0.5% during the write tracking mode. The adjusted current 644 from the adder is applied to a current controlled oscillator 646 which generates an output signal 650 having a frequency which is proportional to the adjusted current 644.

Accordingly, the read and write VCOs are merged into a single VCO 600, and the loop capacitors 620, 622 are now connected in series. A switch 624 has been added to short out read loop capacitor 622 when the combined VCO is not in the reading mode.

Figure 7:
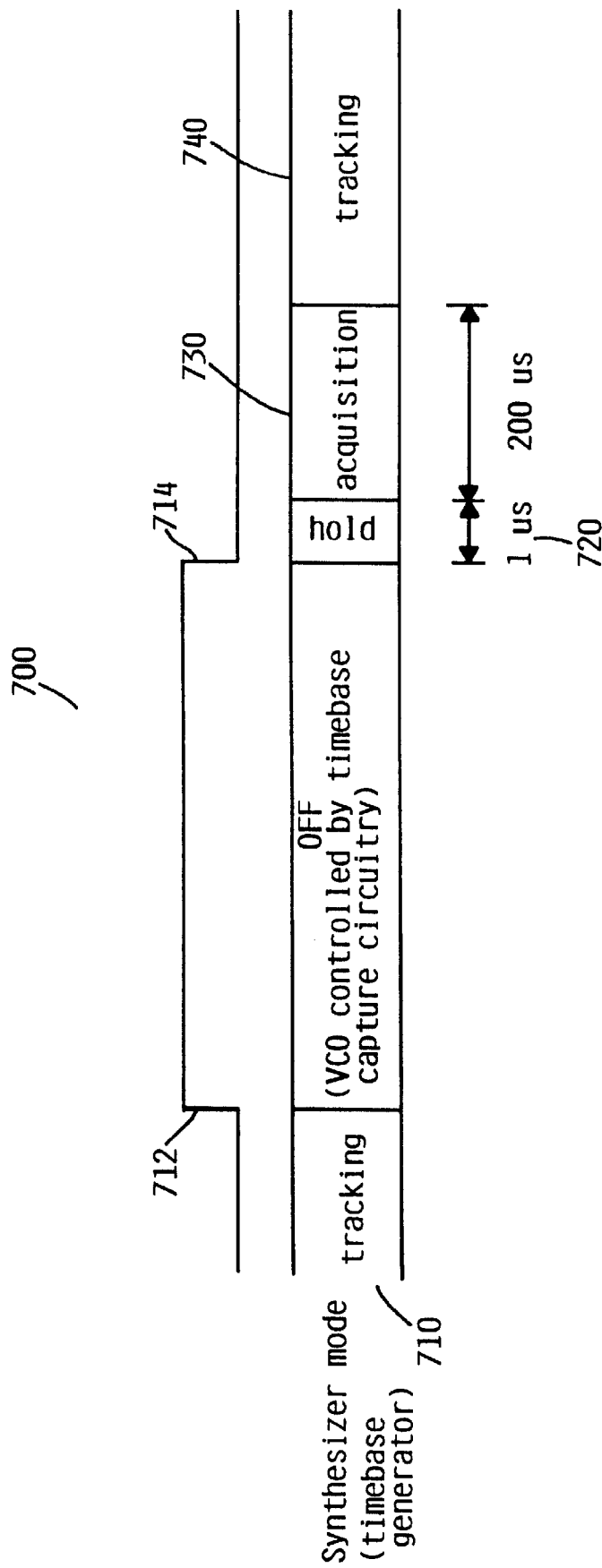
FIG. 7 is a timing diagram illustrating the operation modes of the timebase generator.

Further, according to the present invention, to provide quick relock to the write timebase (this quick relock mode is known as acquisition), while maintaining a very stable timebase during write operations, a "dynamic divider" is used. In FIG. 7, the operation modes 700 of the timebase generator (also known as the synthesizer) are shown.

In FIG. 7, the mode of the synthesizer 710 is shown aligned with the read signal 712. After the read operation completes, as illustrated by the end of the read pulse 714, the synthesizer waits for approximately 1 microsecond 720 before closing the switch on the read loop capacitor and beginning acquisition mode 730. Thus, if the controller initiates back-to-back reads, the VCO remains at the correct frequency. After acquisition, the VCO frequency is correct except for the jitter induced by the dynamic divider. The synthesizer then switches into tracking mode 740, which is jitter-free, and the channel is ready to perform a write operation.

Figure 8:
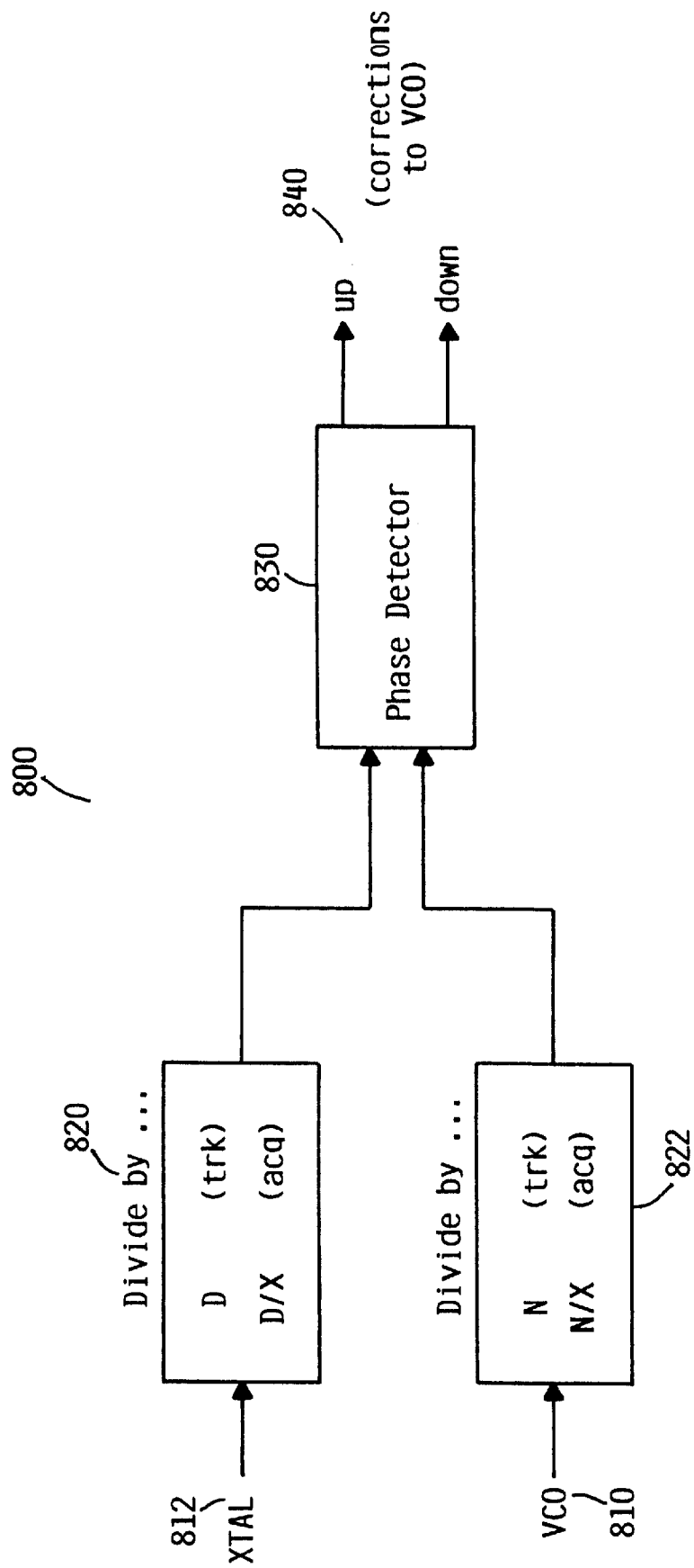
FIG. 8 illustrates a synthesizer implemented according to the present invention.

FIG. 8 illustrates a synthesizer 800 implemented according to the present invention. FIG. 8 illustrates the dividing principle underlying the operation of the synthesizer. The synthesizer includes two clocks, the VCO output 810 and a reference 812. These are run into a phase detector 830 which outputs corrections 840 to the VCO and the loop capacitor. The reference clock 812 may be provided by an external crystal.

In FIG. 8, the crystal (XTAL) divisor 820 is referred to as D, and the VCO divisor 822 is referred to as N. The following formula illustrates how various combinations of N and D can be used to program the VCO to a certain frequency:

$$\text{VCO\_freq} = \frac{N}{D} \cdot \text{XTAL\_freq}$$

To achieve fine granularity of the VCO frequency, the N and D values become large, and as a result, the correction rate (or update rate) out of the phase detector becomes rather low. This makes fast acquisition difficult, as corrections are made at too slow of a rate.

Accordingly, N and D are reduced proportionately when in acquisition. If N and D are both divided by some number, e.g., M, the formula above does not change, and since N and D are now smaller, corrections are made at a proportionately faster rate.

The dynamic dividers 820, 822 will induce a certain amount of frequency jitter while in acquisition mode because the divisor will most likely not be an integer number, and thus it would have to be integrated over several cycles. For example, trying to divide by 4.25 would result in /5/4/4/4 (repeating). Accordingly, the present invention achieves the proper frequency on average, but with an acceptable amount of jitter which disappears once tracking mode is entered (when the divisors switch back to integer numbers).

In summary, the present invention provides a combined read and write VCO by placing the loop capacitors in series with a switch to adjust capacitance between read and write modes, and by using the dynamic divider within the synthesizer to increase the correction rate during acquisition.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A combined voltage controlled oscillator, comprising:
   an oscillator providing an output signal having a frequency that varies proportionately to an oscillator input signal; and
   an adjustable voltage source, the adjustable voltage source having a first configuration for a write mode and a second configuration for a read mode, and the adjustable voltage source providing the oscillator input signal to the oscillator in response to receiving an input current signal, the adjustable voltage source further comprising a first and second capacitor coupled in series and a switch coupled across the second capacitor, the switch being open to provide the first configuration and closed to provide the second configuration;
   a transconductance amplifier for receiving the input signal from the adjustable voltage source and converting the input signal to a current signal having a first current value;
   a current modifier, the current modifier providing a current phase signal according to whether a write or a read mode is selected and whether an acquisition or track mode is selected; and
   an adder coupled to the transconductance amplifier and the current modifier, the adder modifying the current signal according to the current phase signal to produce an adjusted current signal;
   wherein the oscillator comprises a current controlled oscillator coupled to the adder, the current controlled oscillator receiving the adjusted current signal and producing an output signal having a frequency proportional to a magnitude of the current of the adjusted current signal.

2. The combined voltage controlled oscillator of claim 1 wherein the current phase signal provides a ten percent phase change when the acquisition mode is selected.

3. The combined voltage controlled oscillator of claim 1 wherein the current phase signal provides a one percent phase change when the read mode and the tracking mode are selected.

4. The combined voltage controlled oscillator of claim 1 wherein the current phase signal provides a 0.5 percent phase change when the write mode and the tracking mode are selected.

5. The combined voltage controlled oscillator of claim 1 wherein the input current signal has a range of ±1.0 milliamp when the acquisition mode is selected.

6. The combined voltage controlled oscillator of claim 1 wherein the input current signal has a range of ±62.5 microamps when the read mode and the tracking mode are selected.

7. The combined voltage controlled oscillator of claim 1 wherein the input current signal has a range of ±32.0 microamps when the write mode and the tracking mode are selected.

8. The combined voltage controlled oscillator of claim 1 wherein the first capacitor comprises a write capacitor and the second capacitor comprises a read capacitor, the first configuration being a read mode and the second configuration being a write mode.

9. The combined voltage controlled oscillator of claim 8 wherein a predetermined delay is used before closing the switch to provide a predetermined delay between transitioning from the read mode to the write mode to maintain a correct frequency for back-to-back read operations.

10. The combined voltage controlled oscillator of claim 9 wherein the delay comprises a one microsecond delay.

11. A disk drive channel, comprising:
    a write channel providing a modulated write signal to a transducer, the write channel generating a read timebase associated with the modulated write signal;
    a read channel for processing read signals according to a timebase capture reference;
    wherein the read timebase and the timebase capture reference are provided by a combined voltage controlled oscillator, the voltage controlled oscillator further comprising:
    an oscillator providing an output signal having a frequency that varies proportionately to an oscillator input signal;
    an adjustable voltage source, the adjustable voltage source having a first configuration for a write mode and a second configuration for a read mode, and the adjustable voltage source providing the oscillator input signal to the oscillator in response to receiving an input current signal, the adjustable voltage source comprising a first and second capacitor coupled in series and a switch coupled across the second capacitor, the switch being open to provide the first configuration and closed to provide the second configuration;
    a transconductance amplifier for receiving the input signal from the adjustable voltage source and converting the input signal to a current signal having a first current value;
    a current modifier, the current modifier providing a current phase signal according to whether a write or a read mode is selected and whether an acquisition or track mode is selected; and
    an adder, coupled to the transconductance amplifier and the current modifier, the adder modifying the current signal according to the current phase signal to produce an adjusted current signal;
    wherein the oscillator comprises a current controlled oscillator coupled to the adder, the current controlled oscillator receiving the adjusted current signal and producing an output signal having a frequency proportional to a magnitude of the current of the adjusted current signal.

12. The disk drive channel of claim 11 wherein the current phase signal provides a ten percent phase change when the acquisition mode is selected.

13. The disk drive channel of claim 11 wherein the current change signal provides a one percent current change when the read mode and the tracking mode are selected.

14. The disk drive channel of claim 11 wherein the current phase signal provides a 0.5 percent phase change when the write mode and the tracking mode are selected.

15. The disk drive channel of claim 11 wherein the input current signal has a range of ±1.0 milliamp when the acquisition mode is selected.

16. The disk drive channel of claim 11 wherein the input current signal has a range of ±62.5 microamps when the read mode and the tracking mode are selected.

17. The disk drive channel of claim 11 wherein the input current signal has a range of ±32.0 microamps when the write mode and the tracking mode are selected.

18. The disk drive channel of claim 11 wherein the first capacitor comprises a write capacitor and the second capacitor comprises a read capacitor coupled in series and a switch coupled across the read capacitor, the first configuration being a read mode and the second configuration being a write mode.

19. The disk drive channel of claim 18 wherein a predetermined delay is used before closing the switch to provide a predetermined delay between transitioning from the read mode to the write mode to maintain a correct frequency for back-to-back read operations.

20. The disk drive channel of claim 19 wherein the delay comprises a one microsecond delay.

21. A disk drive, comprising:
a magnetic recording disk;
a motor for rotating the magnetic recording disk;
an actuator assembly, the actuator assembly having a transducer disposed at a distal end of an actuator arm, the actuator assembly moving the transducer relative to the rotating magnetic recording disk for reading and writing data on the magnetic recording disk;
a disk drive channel, coupled to the transducer, for processing read and write signals on the magnetic recording disk via the transducer;
a motor controller, coupled to the motor, for controlling the rotation of the magnetic recording disk; and
a actuator controller, coupled to the actuator assembly, for controlling the movement of the actuator arm and the transducer relative to the rotating magnetic recording disk;
wherein the disk drive channel further comprises:
a write channel providing a modulated write signal to a transducer, the write channel generating a read timebase associated with the modulated write signal;
a read channel for processing read signals according to a timebase capture reference, wherein the read timebase and the timebase capture reference are provided by a combined voltage controlled oscillator, the voltage controlled oscillator further comprising:
an oscillator providing an output signal having a frequency that varies proportionately to an oscillator input signal;
an adjustable voltage source, the adjustable voltage source having a first configuration for a write mode and a second configuration for a read mode, and the adjustable voltage source providing the oscillator input signal to the oscillator in response to receiving an input current signal, the adjustable voltage source further comprising a first and second capacitor coupled in series and a switch coupled across the second capacitor, the switch being open to provide the first configuration and closed to provide the second configuration;
a transconductance amplifier for receiving the input signal from the adjustable voltage source and converting the input signal to a current signal having a first current value;
a current modifier, the current modifier providing a current change signal according to whether a write or a read mode is selected and whether an acquisition or track mode is selected and;
an adder coupled to the transconductance amplifier and the current modifier, the adder modifying the current signal according to the current change signal to produce an adjusted current signal;
wherein the oscillator comprises a current controlled oscillator coupled to the adder, the current controlled oscillator receiving the adjusted current signal and producing an output signal having a frequency proportional to a magnitude of the current of the adjusted current signal.

22. The disk drive of claim 21 wherein the current change signal provides a ten percent current change when the acquisition mode is selected.

23. The disk drive of claim 21 wherein the current change signal provides a one percent current change when the read mode and the tracking mode are selected.

24. The disk drive of claim 21 wherein the current change signal provides a 0.5 percent current change when the write mode and the tracking mode are selected.

25. The disk drive of claim 21 wherein the input current signal has a range of ±1.0 milliamp when the acquisition mode is selected.

26. The disk drive of claim 21 wherein the input current signal has a range of ±62.5 microamps when the read mode and the tracking mode are selected.

27. The disk drive of claim 21 wherein the input current signal has a range of ±32.0 microamps when the write mode and the tracking mode are selected.

28. The disk drive of claim 21 wherein the first capacitor comprises a write capacitor and the second capacitor comprises a read capacitor, the first configuration being a read mode and the second configuration being a write mode.

29. The disk drive of claim 28 wherein a predetermined delay is used before closing the switch to provide a predetermined delay between transitioning from the read mode to the write mode to maintain a correct frequency for back-to-back read operations.

30. The disk drive of claim 29 wherein the delay comprises a one microsecond delay.

* * * * *